United States Patent [19]
Sasao et al.

[11] Patent Number: 6,137,815
[45] Date of Patent: Oct. 24, 2000

[54] SEMICONDUCTOR LASER

[75] Inventors: Masanori Sasao; Yoji Okazaki, both of Kanagawa-ken, Japan

[73] Assignee: Fuji Photo Film Co., Ltd., Kanagawa-Ken, Japan

[21] Appl. No.: 08/993,178

[22] Filed: Dec. 18, 1997

[30] Foreign Application Priority Data

Dec. 27, 1996 [JP] Japan ................................. 8-350891

[51] Int. Cl.[7] ........................................................ H01S 3/04
[52] U.S. Cl. ................................ 372/36; 372/34; 385/92; 257/675; 257/676
[58] Field of Search .................................. 372/34, 36, 38, 372/43, 50; 385/92, 88; 257/675, 676

[56] References Cited

U.S. PATENT DOCUMENTS

| | | | |
|---|---|---|---|
| 4,997,243 | 3/1991 | Aiki et al. ................................. | 385/92 |
| 5,214,660 | 5/1993 | Masuko et al. ........................... | 372/34 |
| 5,703,893 | 12/1997 | Komiyama et al. ...................... | 372/43 |
| 5,848,083 | 12/1998 | Haden et al. ............................. | 372/36 |

FOREIGN PATENT DOCUMENTS

| | | |
|---|---|---|
| 3431738 A1 | 3/1986 | Germany . |
| 3-006875 | 1/1991 | Japan . |
| 4-343492 | 11/1992 | Japan . |
| 7-140362 | 6/1995 | Japan . |

*Primary Examiner*—Hemang Sanghavi
*Attorney, Agent, or Firm*—Sughrue, Mion, Zinn, Macpeak & Seas, PLLC

[57] ABSTRACT

A semiconductor laser includes a laser diode chip, a heat radiating plate on which the laser diode chip is mounted and a Peltier element which is integrated with the heat radiating plate. The heat radiating plate is formed of metal whose thermal conductivity is not lower than 230 W/mK.

8 Claims, 1 Drawing Sheet

F I G. 1
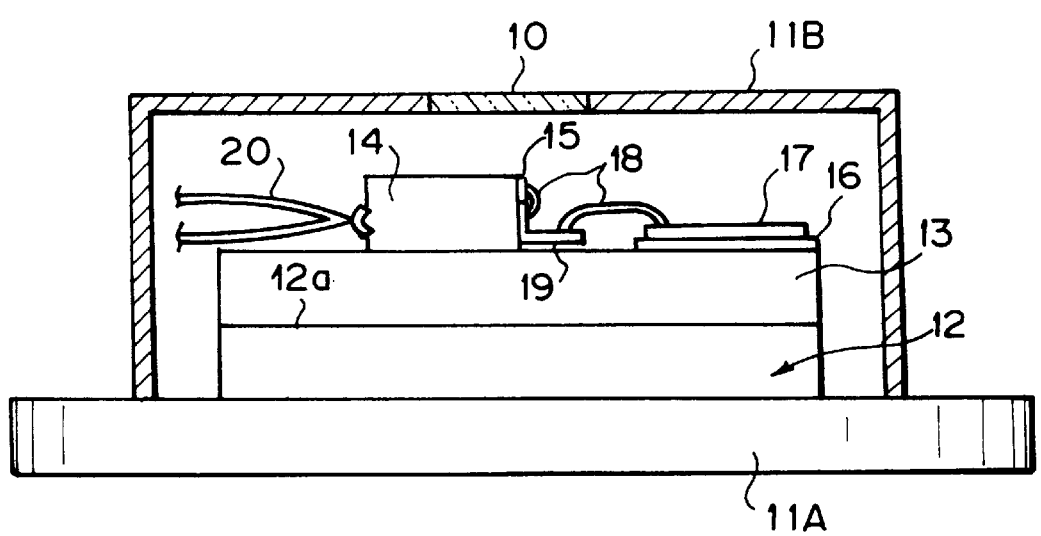

SEMICONDUCTOR LASER

BACKGROUND OF THE INVENTION

1. Field of the Invention

This invention relates to a semiconductor laser, and more particularly to a semiconductor laser in which the temperature of a laser diode chip is controlled by a Peltier element through a heat radiating plate.

2. Description of the Related Art

There have been provided various types of semiconductor lasers. In many of them, a laser diode chip is enclosed in a package and a laser beam emitted from the laser diode chip emanates outside the package through a glass window.

In those of high output types out of such semiconductor lasers, the laser diode chip is mounted on a heat radiating plate and the heat radiating plate is mounted on a Peltier element, and the temperature of the laser diode chip is controlled constant by a temperature detecting means and a temperature control circuit such as the Peltier element and a thermistor.

The cooling surface of the Peltier element is generally formed of alumina. Accordingly the heat radiating plate is also formed of alumina so that the Peltier element and the heat radiating plate are not strained due to change in temperature.

In the conventional semiconductor laser where the temperature of the laser diode chip is controlled constant in the manner described above, there has been a problem that the cooling capacity of the Peltier element is small. For example, in a semiconductor laser of output power of 2 W, the cooling limit temperature under an environmental temperature of 45° C. is rather high and 25 to 30° C. When the cooling capacity of the Peltier element is small, the working wavelength range of the semiconductor laser is limited and/or the service life of the semiconductor laser is shortened.

SUMMARY OF THE INVENTION

In view of the foregoing observations and description, the primary object of the present invention is to satisfactorily increase the cooling capacity in a semiconductor laser in which the temperature of the laser diode chip is controlled by a Peltier element.

The semiconductor laser in accordance with the present invention comprises a laser diode chip, a heat radiating plate on which the laser diode chip is mounted and a Peltier element which is integrated with the heat radiating plate, and is characterized in that the heat radiating plate is formed of metal whose thermal conductivity is not lower than 230 W/mK.

It is preferred that the heat radiating plate be formed of metal whose linear expansion coefficient is substantially equal to that of the part of the Peltier element which is in contact with the heat radiating plate. More specifically when the part of the Peltier element which is in contact with the heat radiating plate is formed of alumina, it is preferred that the heat radiating plate be formed of metal whose linear expansion coefficient is in the range of $6 \times 10^{-6}$ to $8 \times 10^{-6}/°$ C.

As a metal which satisfies the aforesaid conditions on the thermal conductivity and the linear expansion coefficient, for instance, there has been known Cu—W which is an alloy of Cu and W.

More preferably the semiconductor laser of the present invention further comprises an electrical insulating plate which is fixed to a part of the surface of the heat radiating plate, a bonding table which is formed on the electrical insulating plate and a bonding wire which electrically connects the bonding table to the laser diode chip.

Further it is preferred that the heat radiating plate be formed of metal whose linear expansion coefficient is substantially equal to that of the part of the Peltier element which is in contact with the heat radiating plate and at the same time the electrical insulating plate be formed of the same material as said part of the Peltier element.

It has been found that the reason why the cooling capacity is poor in the conventional semiconductor laser is that the thermal conductivity of the heat radiating plate of alumina is low, 17 W/mK, and accordingly heat cannot be dissipated satisfactorily.

When the heat radiating plate is formed of metal such as Cu—W whose thermal conductivity is not lower than 230 W/mK, heat dissipation from the heat radiating plate is much promoted and accordingly, the cooling capacity by the Peltier element is remarkably increased.

When the heat radiating plate is formed of metal whose linear expansion coefficient is substantially equal to that of the part of the Peltier element which is in contact with the heat radiating plate, the Peltier element and the heat radiating plate are not strained due to change in temperature.

In the semiconductor laser of the present invention, since the heat radiating plate is formed of plate, the bonding table cannot be formed directly on the heat radiating plate unlike the case where the heat radiating plate is formed of alumina which is electrically insulating. Accordingly the bonding table may be formed separately from the heat radiating plate. However when an electrical insulating plate is fixed to a part of the heat radiating plate, the bonding table can be formed on the insulating plate, whereby the heat radiating plate can be used for mounting the bonding plate as in the conventional semiconductor laser.

Further when the heat radiating plate is formed of metal whose linear expansion coefficient is substantially equal to that of the part of the Peltier element which is in contact with the heat radiating plate and at the same time the electrical insulating plate is formed of the same material as said part of the Peltier element, the linear expansion coefficient of the heat radiating plate becomes substantially equal to that of the insulating plate, whereby the heat radiating plate and the insulating plate can be prevented from being strained due to change in temperature.

BRIEF DESCRIPTION OF A DRAWING

FIG. 1 is a side view partly cut away of a semiconductor laser in accordance with an embodiment of the present invention.

DESCRIPTION OF THE PREFERRED EMBODIMENT

In FIG. 1, a semiconductor laser in accordance with an embodiment of the present invention comprises a package formed by a stem 11A and a cap 11B, a Peltier element 12 which is fixed in the package, a heat radiating plate 13 which is integrally mounted on the Peltier element 12, a laser diode block 14 fixed on the heat radiating plate 13 and a laser diode chip 15 mounted on the laser diode block 14.

An electrical insulating plate 16 formed of alumina is fixed to a part of the surface of the heat radiating plate 13, and a bonding table 17, which may be, for instance, of Cu, is formed on the insulating plate 16. The bonding table 17 is electrically connected to the laser diode chip 15 through bonding wires 18 and an electrode 19. The insulating plate 16 and the bonding table 17 may be formed by a known film forming technique. For example, the bonding table 17 can be formed by metallizing the surface of the insulating plate 16 with gold.

A thermistor 20 for detecting the temperature of the laser diode chip 15 through the temperature of the laser diode block 14 is mounted on the laser diode block 14. A glass window 10 through which a laser beam emitted from the laser diode chip 15 emanates outside is formed in the cap 11B of the package.

Heat produced by the laser diode chip 15 is dissipated through the heat radiating plate 13. Further the laser diode chip 15 is cooled by the Peltier element 12 through the heat radiating plate 13 and is kept at a predetermined temperature. The Peltier element 12 is driven and controlled by a temperature control circuit (not shown) on the basis of the temperature detected by the thermistor 20.

In this embodiment, the heat radiating plate 13 is formed of Cu—W whose thermal conductivity is 250 W/mK. Since the heat radiating plate 13 is formed of a material which is sufficiently high in thermal conductivity, heat dissipation from the heat radiating plate 13 is satisfactory, whereby the cooling capacity by the Peltier element 12 can be remarkably improved.

Specifically, for example, when the output of the semiconductor laser is 2 W, the cooling limit temperature under an environmental temperature of 45° C. is 10 to 15° C. which is greatly lowered as compared with the conventional value, i.e., 25 to 30° C. Accordingly, the working wavelength range of the semiconductor laser is enlarged and the service life of the semiconductor laser is elongated. Further, the oscillation of the temperature during a transient period upon turning on and off the semiconductor laser can be suppressed to about one fourth of that when the heat radiating plate 13 is formed of alumina.

Further the linear expansion coefficient of alumina, which forms the cooling surface 12a of the Peltier element 12, is $7 \times 10^{-6}/°$ C. and the linear expansion coefficient of Cu—W, which forms the heat radiating plate 13, is $6.9 \times 10^{-6}/°$ C., which is very close to the linear expansion coefficient of alumina. Accordingly the heat radiating plate 13 and the Peltier element 12 are not strained due to change in temperature.

Further since the electrical insulating plate 16 is provided on the heat radiating plate 13, the bonding table 17 can be formed on the heat radiating plate 13, which is a good conductor, whereby the heat radiating plate 13 can be effectively used for mounting the bonding plate 17 as in the conventional semiconductor laser.

Further since the heat radiating plate 13 is formed of Cu—W whose linear expansion coefficient is substantially equal to that of the cooling surface 12a of the Peltier element 12 and at the same time the electrical insulating plate 16 is formed of the same material, alumina, as the cooling surface 12a of the Peltier element 12, the linear expansion coefficient of the heat radiating plate 13 is substantially equal to that of the insulating plate 16, whereby the heat radiating plate 13 and the insulating plate 16 can be prevented from being strained due to change in temperature.

What is claimed is:

1. A semiconductor laser comprising:

a laser diode chip;

a heat radiating plate on which said laser diode chip is mounted; and a Peltier element integrated with said heat radiating plate;

wherein said heat radiating plate (1) is interposed between said laser diode chip and said Peltier element, and (2) is formed of a metal having a thermal conductivity of at least 230 W/mK; and wherein said metal has a linear expansion coefficient that is substantially equal to that of a part of said Peltier element which is in contact with said heat radiating plate.

2. A semiconductor laser as defined in claim 1, wherein said metal is Cu—W.

3. A semiconductor laser comprising:

a laser diode chip;

a heat radiating plate on which said laser diode chip is mounted; and a Peltier element integrated with said heat radiating plate;

wherein said heat radiating plate (1) is interposed between said laser diode chip and said Peltier element, and (2) is formed of a metal having a thermal conductivity of at least 230 W/mK;

wherein said metal has a linear expansion coefficient that is substantially equal to that of a part of said Peltier element which is in contact with said heat radiating plate; and wherein said part is formed of alumina, and said metal has a linear expansion coefficient in the range of $6 \times 10^{-6}$ to $8 \times 10^{-6}/°$ C.

4. A semiconductor laser as defined in claim 3, wherein said metal is Cu—W.

5. A semiconductor laser comprising:

a laser diode chip;

a heat radiating plate on which said laser diode chip is mounted;

a Peltier element integrated with said heat radiating plate, wherein said heat radiating plate (1) is interposed between said laser diode chip and said Peltier element, and (2) is formed of a metal having a thermal conductivity of at least 230 W/mK;

an electrical insulating plate fixed to a surface of said heat radiating plate;

a bonding table formed on said electrical insulating plate; and a bonding wire electrically connecting said bonding table to said laser diode chip.

6. A semiconductor laser as defined in claim 5, wherein said bonding table is formed by metallizing a surface of said insulating plate with gold.

7. A semiconductor laser as defined in claim 5, wherein said metal has a linear expansion coefficient that is substantially equal to that of a part of said Peltier element which is in contact with said heat radiating plate, and said electrical insulating plate is formed of the same material as said part.

8. A semiconductor laser as defined in claim 5, wherein said metal is Cu—W.

* * * * *